United States Patent [19]

Ehman et al.

[11] Patent Number: 4,937,526

[45] Date of Patent: Jun. 26, 1990

[54] ADAPTIVE METHOD FOR REDUCING MOTION AND FLOW ARTIFACTS IN NMR IMAGES

[75] Inventors: Richard L. Ehman; Joel P. Felmlee, both of Rochester, Minn.

[73] Assignee: Mayo Foundation for Medical Education and Research, Rochester, Minn.

[21] Appl. No.: 365,632

[22] Filed: Jun. 13, 1989

Related U.S. Application Data

[63] Continuation-in-part of Ser. No. 276,168, Nov. 23, 1988, abandoned.

[51] Int. Cl.$^5$ .............................................. G01R 33/20
[52] U.S. Cl. ..................................... 324/309; 324/306
[58] Field of Search ............... 324/300, 306, 307, 309, 324/318, 322; 128/653

[56] References Cited

U.S. PATENT DOCUMENTS

| 4,682,109 | 7/1987 | Cuppen | 324/309 |
| 4,761,613 | 8/1988 | Hinks | 324/309 |
| 4,830,012 | 5/1989 | Riederer | 324/309 |

OTHER PUBLICATIONS

Haacke, Mark E. and Patrick, John L. "Reducing Motion Artifacts in Two-Dimensional Fourier Transform Imaging," *Magnetic Resonance Imaging*, vol. 4, pp. 359–376, 1986.

Cuppen, et al. "Reduction of Motion Artifacts by Data Postprocessing," Book of Abstracts, Fourth Annual Meeting, Aug. 19–23, 1985.

"The Effect of Motion on Two-Dimensional Fourier Transformation Magnetic Resonance Images", C. L. Schultz et al., Radiology 1984; 152:117–121.

"Influence of Physiologic Motion on the Appearance of Tissue in MR Images", R. L. Ehman et al., Radiology 1986; 159:777–782.

"Respiratory Effects in Two-Dimensional Fourier Transform MR Imaging", L. Axel et al., Radiology 1986; 160:795–801.

"The Magnetic Field Dependence of the Breathing Artifact", M. L. Wood et al., Mag. Res. Imag. 1986; 4:387–392.

"Suppression of Respiratory Motion Artifacts in Magnetic Resonance Imaging", M. L. Wood et al., Med. Phys. 1986; 13(6):794–805.

"Instant Images of the Human Heart Using a New, Whole Body MR Imaging System", R. R. Rzedzian et al., AJR 1986; 149:245–250.

"Motion Artifact Reduction with Fast Spin-Echo Imaging", D. D. Stark et al., Radiology 1987; 164:183–191.

"Cardiac Imaging Using Gated Magnetic Resonance", P. Lanzer et al., Radiology 1984; 150:121–127.

"Magnetic Resonance Imaging with Respiratory Gating: Techniques and Advantages", R. L. Ehman et al., AJR 1984; 143:1175–1182.

"Respiratory Ordered Phase Encoding (ROPE): A Method for Reducing Respiratory Motion Artifacts in MR Imaging", D. R. Bailes et al., Jour. Comp. Asst. Tomo. 1985; 9(4):835–838.

"Motion Artifact Suppression Technique (MAST) for MR Imaging", P. M. Pattany et al., Jour. Comp. Asst. Tomo. 1987; 11(3):369–377.

"Spatial Presaturation: A Method for Suppressing Flow Artifacts and Improving Depiction of Vascular Anat- (List continued on next page.)

Primary Examiner—Michael J. Tokar
Attorney, Agent, or Firm—Quarles & Brady

[57] ABSTRACT

An NMR data set which is acquired with applied phase encoding and read-out gradients is corrected to reduce motion artifacts and increase image sharpness. The acquired NMR data set is examined to detect bulk displacements of the object being imaged and phase displacements caused by motion. This information is employed to produce correction operators which are applied to the NMR image data set. One or more navigator signals may also be acquired during the scan to produce an NMR data set from which the corrective operators can more readily be derived.

14 Claims, 7 Drawing Sheets

OTHER PUBLICATIONS omy in MR Imaging", J. P. Felmlee et al., Radiology 1987; 164:559–564.

"Frodo Pulse Sequences: A New Means of Eliminating Motion, Flow, and Wraparound Artifacts", R. R. Edelman et al., Radiology 1988; 166:231–236.

"Craniocaudal Movements of the Liver, Pancreas, and Kidneys in Respiration", L. Suramo et al., Acta Radiol (Diagn) (Stockh) 1984; 25:129–131.

"Monitored Echo Gating (Mega) for the Reduction of Motion Artifacts", R. S. Hinks, presented at the meeting of the Society for Magnetic Resonance Imaging, Feb. 28, 1988, #107, p. 48.

*The Fourier Transform and Its Applications*, R. N. Bracewell, McGraw-Hill Book Co., 2nd Ed. 1978, p. 104.

"Effects of Diffusion on Free Precession in Nuclear Magnetic Resonance Experiments", H. Y. Carr et al., Phys. Rev. 1954; 4:630–8.

"Verification and Evaluation of Internal Flow and Motion", P. R. Moran et al., Radiology 1985; 154:433–441.

"Direct NMR Imaging of Heart Wall and Blood Flow Velocity", P. Van Dijk, Jour. Comp. Asst. Tomo. 1984; 8:429–436.

"Blood Flow Imaging with MR: Spin-Phase Phenomena", G. K. Von Schulthess et al., Radiology 1985; 157:687–695.

"Blood Flow Effects in Magnetic Resonance Imaging", L. Axel, AJR 1984; 143:1157–1166.

"Blood Flow: Magnetic Resonance Imaging", W. G. Bradley et al., Radiology 1985; 154:443–450.

ADAPTIVE METHOD FOR REDUCING MOTION AND FLOW ARTIFACTS IN NMR IMAGES

CROSS REFERENCE

This application is a continuation-in-part of application Ser. No. 07/276,168, filed Nov. 23, 1988 now abandoned.

BACKGROUND OF THE INVENTION

The field of the invention is nuclear magnetic resonance imaging methods and systems. More particularly, the invention relates to a method for reducing image artifacts caused by flow and motion.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the z-y plane to produce a net transverse magnetic moment $M_1$, which is rotating, or spinning, in the x-y plane at the Larmor frequency. The degree to which the net magnetic moment $M_z$ is tipped, and hence the magnitude of the net transverse magnetic moment $M_1$ depends primarily on the length of time and the magnitude of the applied excitation field $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_0$, is determined by the magnitude of the transverse magnetic moment $M_1$. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. This is also called the longitudinal relaxation process as it describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more excitation pulses ($B_1$) of varying magnitude and duration. Such excitation pulses may have a narrow frequency spectrum (selective excitation pulse), or they may have a broad frequency spectrum (nonselective excitation pulse) which produces transverse magnetization $M_1$ over a range of resonant frequencies. The prior art is replete with excitation techniques that are designed to take advantage of particular NMR phenomena and which overcome particular problems in the NMR measurement process. The present invention may be used with any of these pulse sequences.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques, such as multiple angle projection reconstruction and Fourier transform (FT). Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal. As is well known, the NMR signal may be a free indication decay (FID) or, preferably, a spin-echo signal.

The preferred embodiments of the invention will be described in detail with reference to a variant of the well known FT technique, which is frequently referred to as "spin-warp". The spin-warp technique is discussed in an article entitled "Spin Warp NMR Imaging and Applications to Human Whole-Body Imaging" by W. A. Edelstein et al., *Physics in Medicine and Biology*, Vol. 25, pp. 751-756 (1980).

Briefly, the spin-warp technique employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a read-out magnetic field gradient ($G_x$) in a direction orthogonal to the phase encoding direction. The read-out gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed. Object motion during the acquisition of NMR image data produces both blurring and "ghosts" in the phase-encoded direction. Ghosts are particularly apparent when the motion is periodic, or nearly so. For most physiological motion each view of the NMR signal is acquired in a period short enough that the object may be considered stationary during the acquisition window. In such case the blurring and ghosting is due to the inconsistent appearance of the object from view to view. Motion that changes the appearance between views such as that produced by a patient moving, by the respiration or the cardiac cycle, or by peristalsis, is referred to hereinafter as "view-to-view motion". Motion may also change the amplitude and phase of the NMR signal as it evolves during the pulse sequence and such motion is referred to hereinafter as "in-view motion".

Both blurring and ghosting can be reduced if the data acquisition is synchronized with the functional cycle of the object to reduce view-to-view motion. This method is known as gated NMR scanning, and its objective is to acquire NMR data at the same point during successive functional cycles so that the object "looks" the same in each view. The drawback of gating is that NMR data may be acquired only during a small fraction of the object's functional cycle, and even when the shortest acceptable pulse sequence is employed, the gating technique can significantly lengthen the data acquisition time. Some of these methods are disclosed in U.S. Pat. Nos. 4,751,462; 4,567,893 and 4,663,591. None of them have proven entirely satisfactory because they either depend upon perfectly periodic motion, or they increase the scan time significantly, or they produce low signal-to-noise images.

Several NMR pulse sequences have been proposed to either desensitize the NMR measurement to the phase perturbations caused by flowing spins as described in U.S. Pat. No. 4,728,890, or to sensitize it to flow in such a manner that the effects of flow can properly be separated from the reconstructed images as described in U.S. Pat. No. RE 32,701. None of these methods have proven entirely satisfactory, either from a performance standpoint, or because of their adverse impact on scan time or the type of NMR measurements that may be performed.

In our prior U.S. Pat. No. 4,715,383, we disclose a method for reducing motion and flow artifacts in NMR images. While this method substantially improves NMR images by suppressing artifacts caused by spins outside the region of interest, it does not correct for the motion artifacts produced by spins located inside the region of interest.

All of the prior methods for reducing motion and flow artifacts focus on the data acquisition procedure. They change the NMR pulse sequence itself, they change the order in which the pulse sequences in a scan are executed, or they synchronize the execution of the pulse sequence with the motion of the subject under study. Their objective is to produce a set of NMR data which is minimally affected by flow and motion and which can, therefore, be used to construct a clear, ghost-free image.

SUMMARY OF THE INVENTION

The present invention is a method for reducing motion and flow artifacts in an NMR image by correcting the set of NMR data which has been acquired during a scan to remove the effects of motion and flow before the image is reconstructed. More specifically, the invention includes transforming the NMR data set to create a hybrid-space data array; producing a correction data array using the data in the hybrid-space data array; and applying the data in the correction data array to the NMR data set produced by the NMR system to reduce flow and motion artifacts in the image which is reconstructed from the NMR data set. The correction data array which is produced in accordance with one aspect of the present invention corrects for view-to-view motion artifacts and the correction data array which is produced in accordance with another aspect of the invention corrects for in-view motion and flow artifacts.

A general object of the invention is to provide a motion and flow artifact correction method which can be employed after the NMR data has been acquired. The present invention enables the NMR data set to be corrected retrospective of its acquisition and, therefore, it may be used in addition to any motion or flow artifact suppression techniques which have been employed in the past. To the extent that the acquired NMR data is affected by motion or flow, the present invention will detect it and automatically correct the NMR data so that the affect is reduced or eliminated.

Another aspect of the invention is to acquire "navigator" NMR data along with the usual image NMR data within the same pulse sequence. The navigator NMR data enables the corrections for view-to-view and in-view motion artifacts to be made more accurately. A navigator NMR signal is produced in each pulse sequence along with the image NMR signal and a data set is acquired for both. The corrective values are determined using the navigator data set and the corrections are made to the image data set.

A more specific object of the invention is to correct the NMR data set for view-to-view artifacts caused by motion or flow in any direction. The navigator signal can be acquired in the presence of a read-out magnetic field gradient which is oriented in any direction. The shift corrections which are produced according to the present invention, will correct for errors caused by view-to-view motion or flow in the direction of the navigator signal read-out gradient By acquiring more than one navigator signal in the pulse sequence in the presence of read-out gradients oriented in respective different directions, shift corrections are produced which correct for view-to-view motion in the corresponding directions. For example, shift corrections can be made for motion along both the x axis and the y axis of the NMR system.

Yet another specific object of the invention is to correct the NMR data set for in-view artifacts caused by motion or flow in any direction. The phase corrections P which are produced according to the present invention offset artifact causing systematic noise produced by in-view motion or flow regardless of its direction.

Still another aspect of the present invention is that both in-view and view-to-view motion and flow artifact correction can be applied to the same NMR data set. Both the in-view correction data array and the view-to-view correction data array can be applied to the NMR data set.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
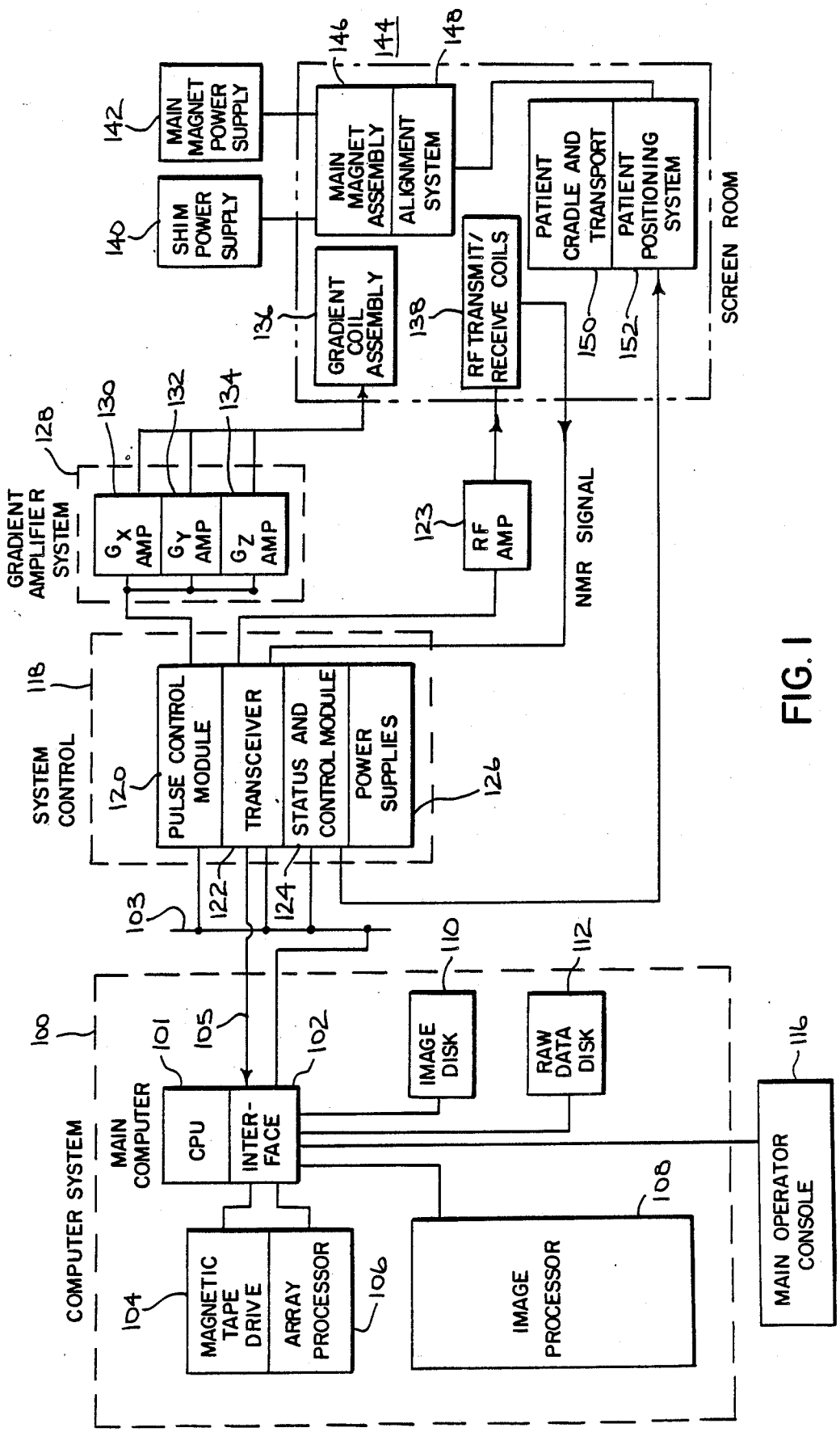
FIG. 1 is a block diagram of an NMR system which employs the present invention.

Referring to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, grayscale adjustment and real time data display. The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape.

The computer system 100 exercises control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 22, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency signal to an RF power amplifier 123 which then energizes RF coils 138 which are situated within main magnet assembly 146. The NMR signals radiated by the excited spin in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 412 is utilized to bring the polarizing field produced by the magnet to the proper operating strength of 1.5 Tesla and is then disconnected.

To minimize interference from external sources, the NMR system components comprised of the main magnet assembly, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Figure 2:
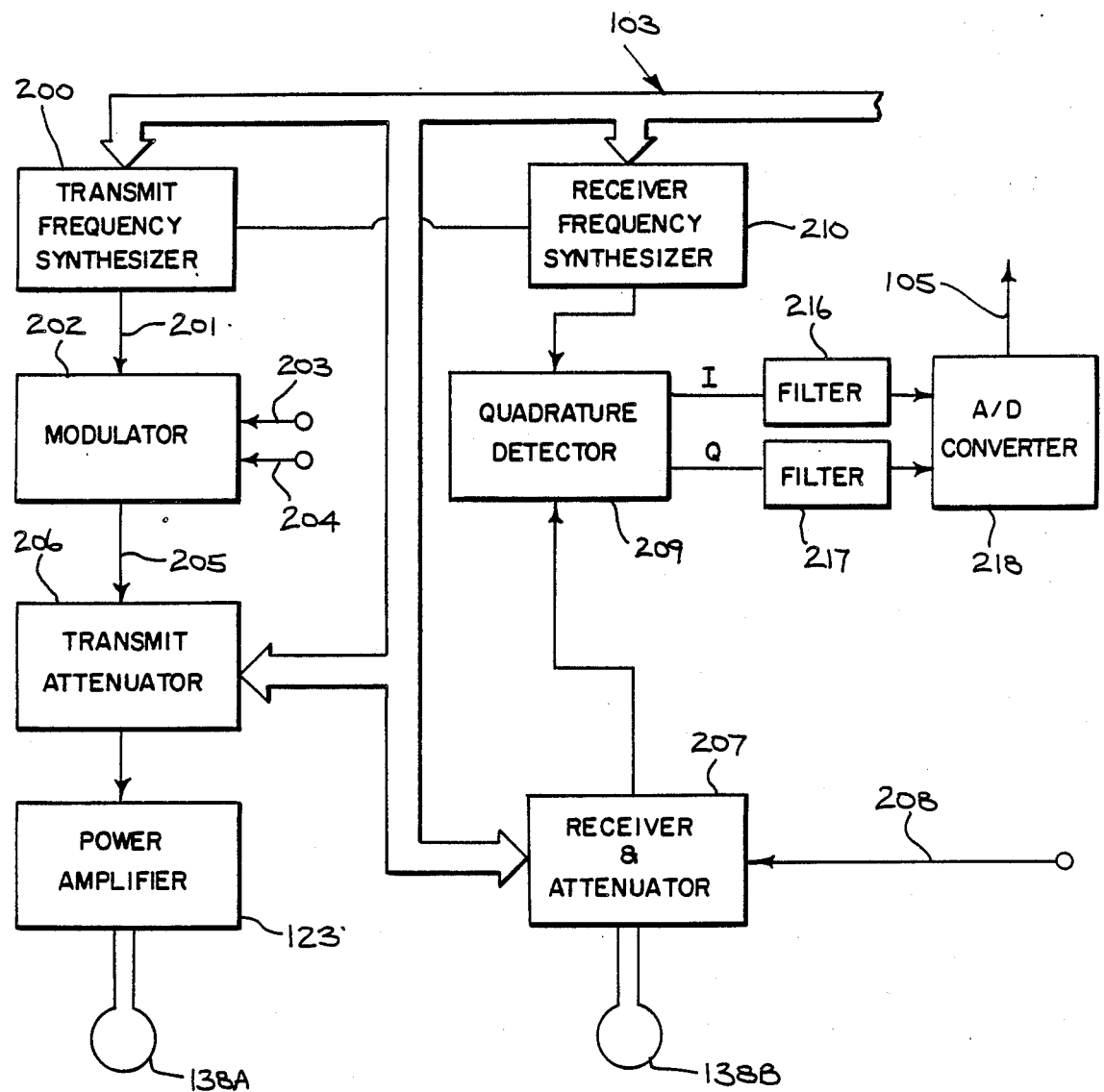
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through line 203, and the resulting RF excitation signal is turned on and off in response to a control signal which is received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmitter coil 138A.

Referring still to FIGS. 1 and 2, the NMR signal produced by the excited spin in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through anti-aliasing filters 216 and 217 to a pair of analog to digital converters indicated collectively at 218. The quadrature detector 209 also receives an RF reference signal from a second frequency synthesizer 210 and this is employed by the quadrature detector 209 to sense the amplitude of that component of the NMR signal which is in phase with the transmitter RF carrier (I signal) and the amplitude of that component of the NMR signal which is in quadrature therewith (Q signal).

The I and Q components of the received NMR signal are continuously sampled and digitized by the A/D converter 218 at a sample rate of 64 kHz throughout the acquisition period. A set of 256 digital numbers are acquired for each I and Q component of the NMR signal, and these digital numbers are conveyed to the main computer 101 through the serial link 105.

Figure 3:
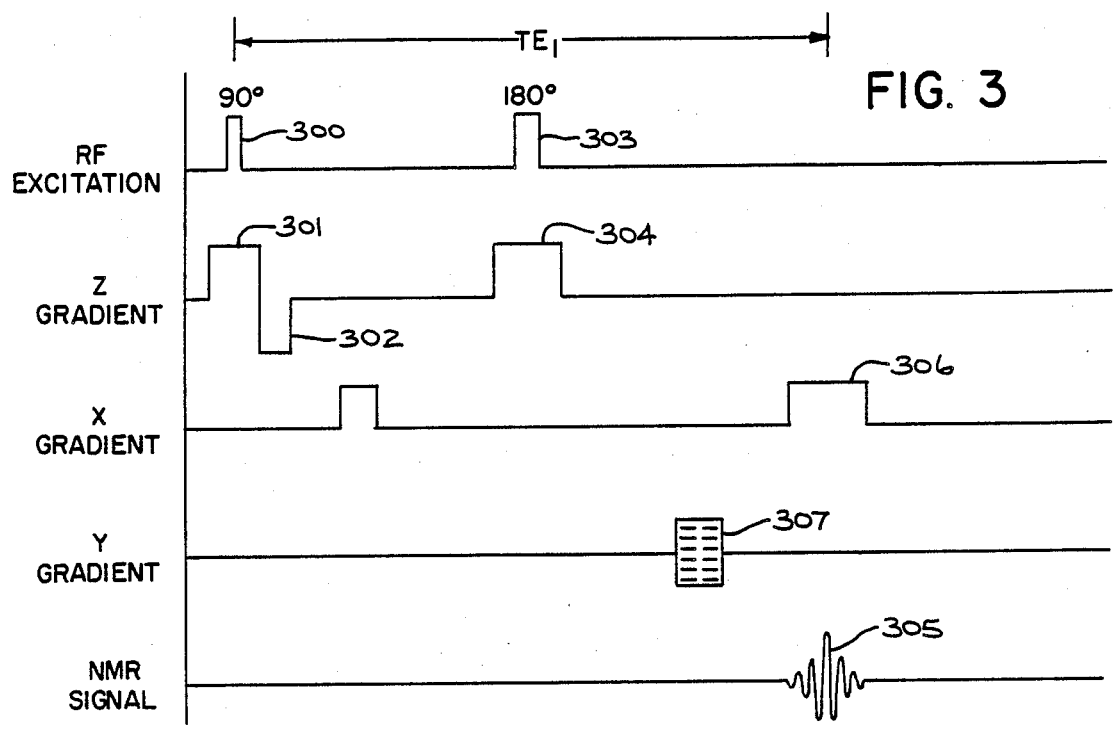
FIG. 3 is a graphic representation of a conventional NMR pulse sequence used to acquire data to produce an image.

The NMR system of FIG. 1 performs a series of pulse sequences to collect sufficient NMR data to reconstruct an image. One such pulse sequence is shown in FIG. 3. This sequence performs a slice selection by applying a 90° selective RF excitation pulse 300 in the presence of a z axis gradient pulse 301 and its associated rephasing pulse 302. After an interval $TE_1/2$, a 180° selective RF excitation pulse 303 is applied in the presence of another z axis gradient pulse 304 to refocus the transverse magnetization at the time $TE_1$ and produce an echo NMR signal 305.

To position encode the echo NMR signal 305, an x axis read-out gradient pulse 306 is applied during the acquisition of the NMR signal 305. The read-out gradient frequency encodes the NMR signal 305 in the well known manner. In addition, the echo NMR signal 305 is position encoded along the y axis by a phase encoding gradient pulse 307. The phase encoding gradient pulse 307 has one strength during each echo pulse sequence and associated NMR echo signal 305, and it is typically incremented in steps through 256 discrete strengths ($-128$ to $+128$) during the entire scan. As a result, each of the 256 NMR echo signals 305 acquired during the scan is uniquely phase encoded.

It is, of course, usual practice to repeat the pulse sequence for each phase encoding gradient value one or more times and to combine the acquired NMR signals in some manner to improve signal-to-noise and to offset irregularities in the magnetic fields. In the following discussion, it is assumed that such techniques may be used to acquire the NMR data set which is to be corrected.

Figure 4:
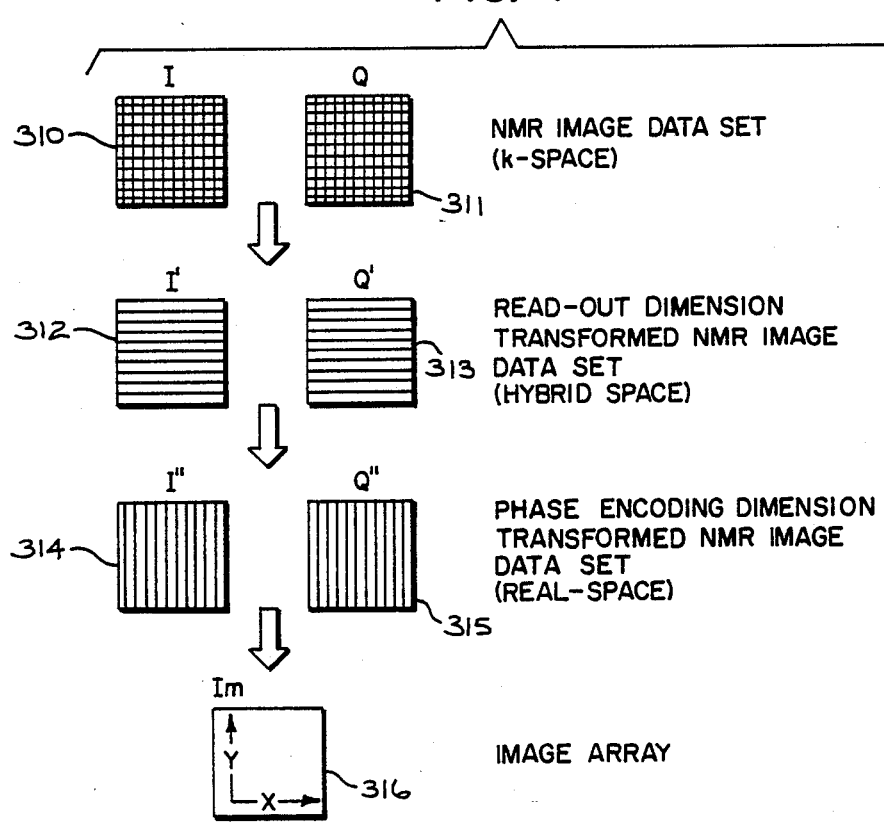
FIG. 4 is a pictorial representation of how an image is reconstructed from NMR data acquired using the pulse sequence of FIG. 3.

Referring particularly to FIG. 4, the acquired NMR data is stored in the data disk 112 (FIG. 1) in the form of two 256×256 element arrays 310 and 311. The array 310 contains the in-phase magnitude values I and the array 311 contains the quadrature values Q. Together these arrays 310 and 311 form an NMR image data set which defines the acquired image in what is referred to in the art as "k-space".

To convert this k-space NMR data set into data which defines the image in real space (i.e. Cartesian coordinates), a two step Fourier transformation is performed on the I and Q arrays 310 and 311. The transformation is performed first in the read-out direction which is the horizontal rows of the arrays 310 and 311 to produce two 256×256 element arrays 312 and 313. The array 312 contains the in-phase data and is labeled I', while the array 313 contains the quadrature data and is labeled Q'. The I' and Q' arrays 312 and 313 define the acquired image in what is referred to in the art as "hybrid-space". This first transformation of the acquired NMR data set is expressed mathematically as follows:

$$S_{xy}(k\text{-space}) \rightarrow S_{x'y}(\text{hybrid-space}) \quad (1)$$

$$S_{x'y} = \frac{1}{256} \sum_{x=0}^{255} S_{xy} e^{-i2\pi xx'/256}$$

The second transformation is performed in the phase encoding direction which is the vertical columns of the arrays 312 and 313 to produce two 256×256 element arrays 314 and 315 The array 314 contains the transformed in-phase values and is labeled I″, while the array 315 contains the quadrature values and is labeled Q″. This second transformation may be expressed mathematically as follows:

$$S_{x'y}(\text{hybrid-space}) \rightarrow S_{x'y'}(\text{real space}) \quad (2)$$

$$S_{x'y'} = \frac{1}{256} \sum_{y=0}^{255} S_{x'y} e^{-i2\pi yy'/256}$$

The arrays 314 and 315 are a data set which defines the acquired image in real space and the elements thereof are used to calculate the intensity values in a 256×256 element image array 316 in accordance with the following expression:

$$Im_{xy} = \sqrt{(I''_{xy})^2 + (Q''_{xy})^2} \quad (3)$$

The 256×256 elements of the image array 316 are mapped to the main operator console 116 (FIG. 1) for display on a CRT screen.

The above described NMR system and pulse sequence is representative of the current state of the art. The diagnostic quality of the image which is obtained is determined by the extent to which the acquired NMR signals are degraded by superimposed thermal (statistical) noise and systematic (artifact) noise (which includes unsharpness). The sources of thermal noise are well understood. The ratio of NMR signal intensity to thermal noise is determined by such factors as polarizing magnetic field strength, RF receiver coil configuration, the particular pulse sequence used, and the amount of signal averaging used. Systematic noise, mainly resulting from physiological motion, may degrade the NMR image far beyond the fundamental limit set by the thermal noise. Indeed, the diagnostic quality of many NMR images is limited far more by motion artifact and other forms of systematic noise than by intrinsic thermal noise. However, in contrast to thermal noise, there is no inherent limit on the extent to which systematic noise can be reduced.

It is the reduction of systematic noise and unsharpness which the present invention addresses. Whereas prior techniques address this problem with improvements to the NMR system hardware (for example, cardiac and respiratory gating circuits) or with improvements to the pulse sequence (for example, motion desensitizing gradient pulses), the present invention typically addresses the problem retrospectively. More specifically, it is a discovery of the present invention that systematic noise can be easily detected by examining the NMR data set in hybrid-space. Systematic noise caused by view-to-view motion as well as systematic noise caused by in-view motion can be detected. Corrective operators can then be calculated and used to eliminate the systematic noise from the NMR image data set. The usual image reconstruction process can then be performed using the corrected NMR image data set to produce an image which is substantially free of artifacts caused by motion.

Figure 5:
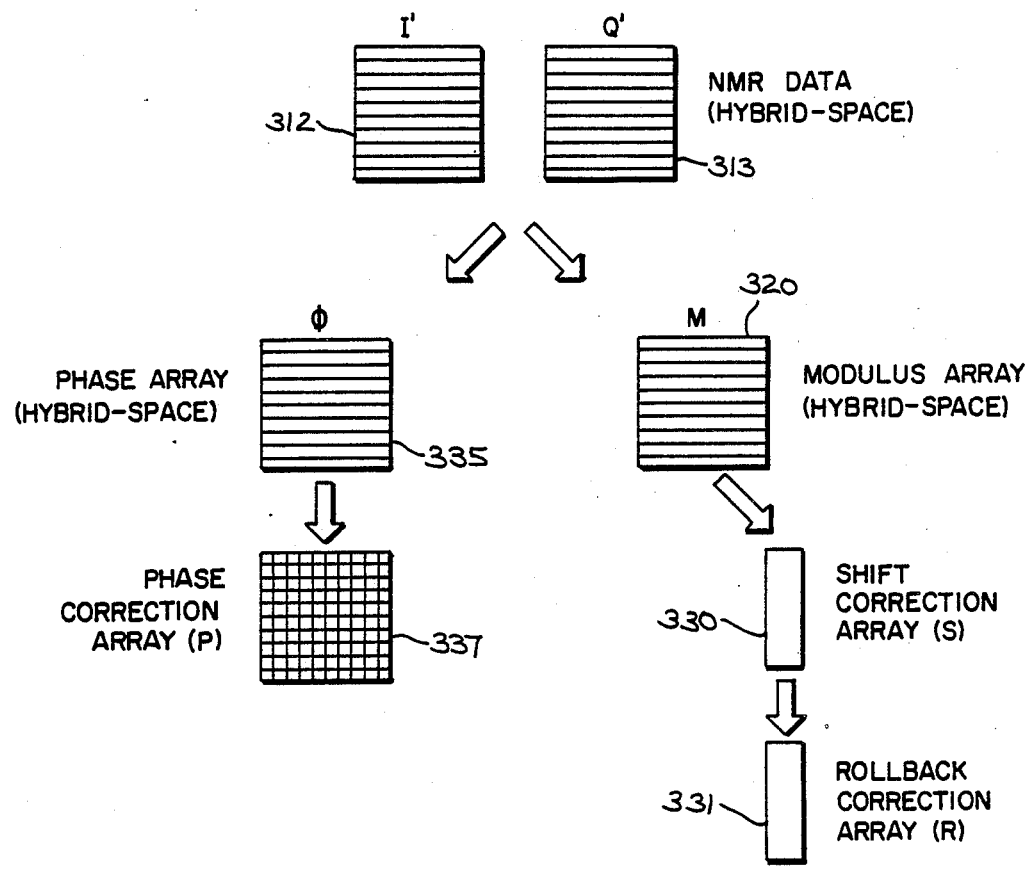
FIG. 5 is a pictorial representation of how correction values are calculated according to the present invention.

Referring to FIG. 5, the first step is to produce the hybrid-space I′ and Q′ arrays 312 and 313 as described above (equation 1). The image data set itself can be used to produce the hybrid-space arrays 312 and 313, or as will be described in more detail below, separate NMR data produced by a navigator NMR signal within the same pulse sequence can be used. In either case, corrective values for both view-to-view and in-view systematic noise can be calculated from the hybrid-space arrays.

Figure 6:
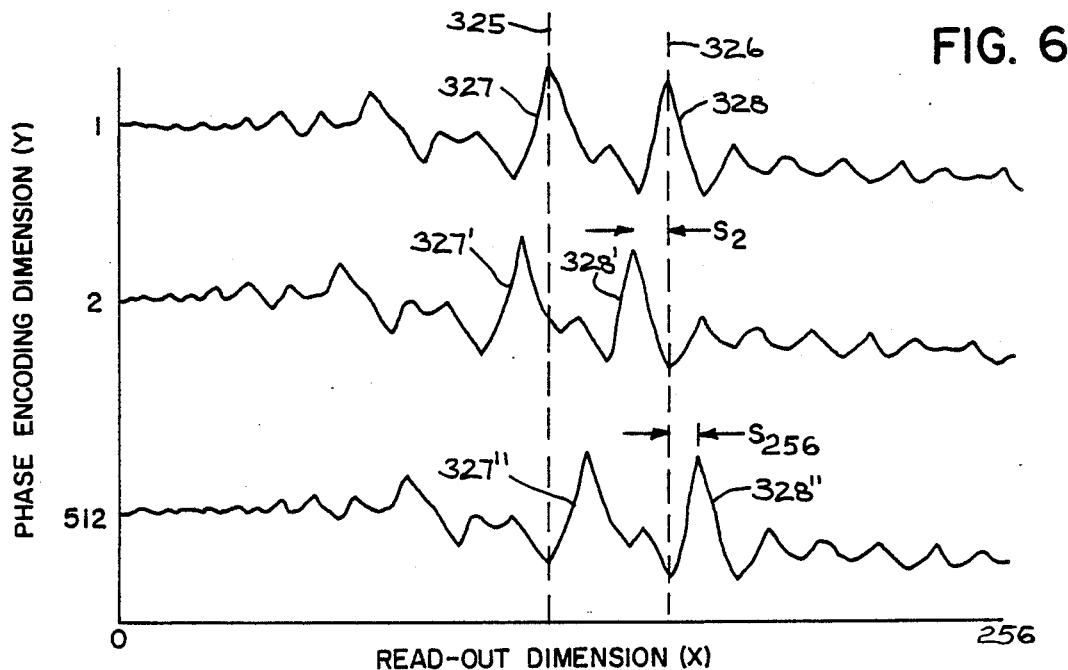
FIG. 6 is a graphic representation of data in the modulus array of FIG. 5.

Referring to FIGS. 5 and 6, it has been discovered that view-to-view systematic noise can be detected in the magnitude information contained in the hybrid-space arrays 312 and 313. Accordingly, the next step in the process is to produce a 256×256 modulus array (M) 320. This is accomplished by calculating each element $M_{xy}$ of the modulus array 320 from the corresponding elements $I'_{xy}$ and $Q'_{xy}$ of the hybrid-space arrays 312 and 313.

$$M_{xy} = \sqrt{(I'_{xy})^2 + (Q'_{xy})^2} \quad (4)$$

where:
x = array column number, 1–256; and
y = array row number, 1–256.

It is a discovery of the present invention that view-to-view motion in the direction of the associated read-out gradient can be seen as a shifting left or right of the modulus data in each row of the modulus array 320. This is illustrated in FIG. 6, where each graph is the modulus values in a horizontal row of the modulus array 320 plotted as a function of its column number in the array 320. Although each graph is slightly different due to the differences in the amount of phase encoding, the graphs do have significant peaks which should occur at the same column number of the array 320. This is illustrated by the dashed lines 325 and 326 through the peaks 327 and 328 in the graph of the first row (y=1). The corresponding peaks 327′ and 328′ in the graph of the second row (y=2) are shifted to the left of the dashed lines 325 and 326, and the corresponding peaks 327″ and 328″ in the last row of data (y=256) are shifted to the right. Examination of the remaining 509 rows of the modulus array 320 would show similar shifts in varying amounts which are caused by view-to-view movement of the subject.

The next step in the process is to determine the amount, S, by which each row of modulus data must be shifted to bring it into correlation with a reference row. This cross correlation may be performed in a number of ways. In the preferred embodiment a reference row ($M_r$) in the modulus array 320 is selected and it is cross correlated with each of the other 255 rows $M_y$. This is done by determining how much each row $M_y$ must be shifted left or right to maximize the sum of the product of its elements and the corresponding elements in the reference row $M_r$.

In other words, the following expression is calculated and stored:

$$\sum_{x=1}^{256} M_{rx}(M_{yx}) \quad (5)$$

Figure 7:
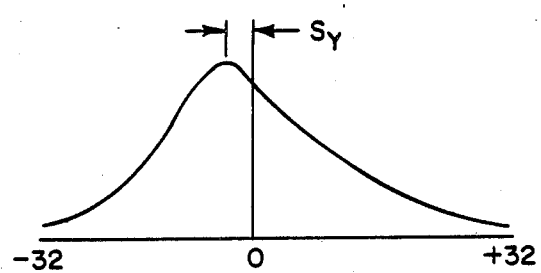
FIG. 7 is a graphic representation of the correlation process used to produce the shift correction array of FIG. 5.

The data on row $M_y$ is then shifted one position and the process is repeated These calculations are performed for $M_y$ shifted between −32 and +32 positions, although these can be extended if necessary for larger displacements. A plot of an exemplary correlation curve which results from these sixty-four calculations is shown in FIG. 7. It can be seen that the peak in this exemplary curve occurs when the row of modulus data $M_y$ is shifted to the left a few positions. Accordingly, a corrective value $S_y$ is determined by finding the number of shifts needed to produce the peak in the correlation curve. A shift correction value $S_y$ is calculated for each row (y=1 to 256) of the modulus array 320 and is stored in a 1×256 element shift correction array 330. There are many other ways to correlate each row in the modulus array 320.

A very significant reduction in view-to-view motion in the x axis can be achieved by applying the correction values S directly to the modulus array 320 and reconstructing an image from this corrected NMR data. This is accomplished by shifting the data in each row of the modulus 320 by the amount indicated by the corresponding element of the shift correction array 330. Then, the values in the I' and Q' hybrid-space arrays 312 and 313 are calculated using the corrected modulus values and the known phase angle for each element. An image can then be reconstructed in the usual fashion from the corrected I' and Q' hybrid-space arrays 312 and 313 as described above.

While the above-described correction procedure provides significant improvement in image quality, further improvements can be made. When the shift correction S is made, a small amount of phase error is introduced into the NMR data set. This is due to the phase rollover which occurs in any NMR system as a result of asymmetry in the echo signal in its acquisition window. The signal represented by the elements in each column of the I' and Q' hybrid arrays 312 and 313 contain the same amount of rollover phase, and the amount of rollover phase changes linearly at the rollover rate $K_R$ as the arrays are traversed from left to right through its columns (x=1 to 256). Thus, when data in a row is shifted left or right to make the S correction discussed above, the data moves into a column with a different phase value than the column of its origin. This rollover phase can be corrected and is a function of the amount which the data was shifted:

$$\Phi R = K_R * S.$$

The rollback correction values for each row in hybrid-space is calculated to produce a 1×256 element rollback correction array 331. Each element in the array 331 indicates the phase correction which must be made to all elements in its corresponding row of the I' and Q' hybrid-space arrays 312 and 313. How these phase corrections are actually made will be discussed in more detail below.

The correction made thus far accounts for view-to-view motion along the read-out x axis. As will be discussed in more detail below, similar corrections can be made along the phase encoding y axis by using a special navigator signal in the same pulse sequence as the image signal and which is acquired in the presence of a y axis read-out gradient pulse.

The above-described corrections do not account for phase errors in the NMR data due to in-view motion or flow. Such errors occur because the spins are moving during the pulse sequence. It is a further discovery of the present invention that these phase errors can be detected in the k-space or the hybrid-space NMR data set.

Referring to FIGS. 5 and 8, the procedure begins again with the I' and Q' hybrid-space arrays 312 and 313. This data set is used to calculate the phase $\Phi$ of the acquired NMR signal at each of the 256 sample times and at each of the 256 views. A 256 by 256 element phase array 335 is produced, with each of its elements having a value which is calculated as follows:

$$\Phi_{xy} = TAN^{-1}(Q'_{XY}/I'_{xy})$$

Figure 8A:
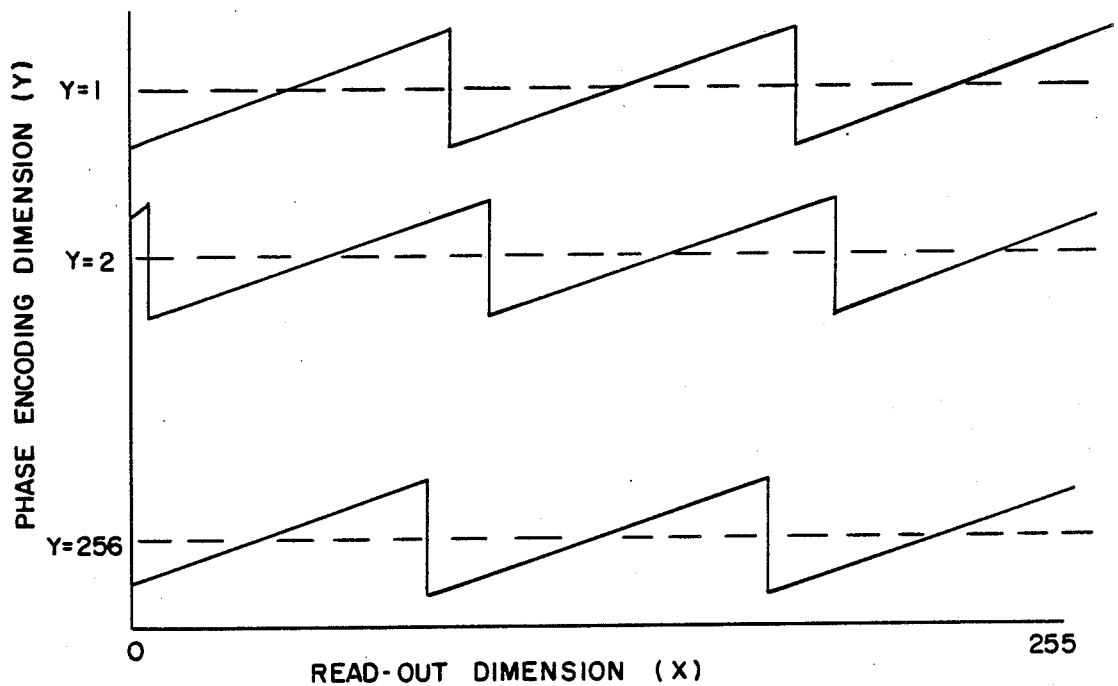
FIGS. 8a and 8b are graphic representations of data in the phase array of FIG. 5 and the process used to produce the phase correction array of FIG. 5.
Figure 8B:
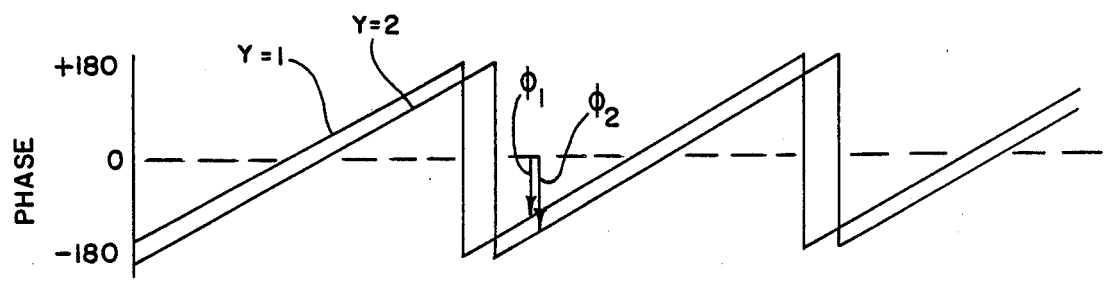

It is a discovery of the present invention that the calculated phase $\Phi$ should have the same value along any column (y=1 to 256) of the phase array 335. This is shown graphically in FIG. 8a where the calculated phase $\Phi$ for three rows of data has been plotted as a function of column number (x=1 to 256). For any given NMR data set which is produced without phase encoding gradients (i.e. a navigator signal), these plots will be substantially the same if there are no phase errors. To the extent that the calculated phase $\Phi$ differs in any column, that difference represents a phase error which should be corrected. This is graphically illustrated in FIG. 8b where two of the phase plots in FIG. 8a are superimposed on one another to reveal differences in their values over the central region. These differences are illustrated by the arrows $\Phi_1$ and $\Phi_2$.

To correct for the phase error, therefore, a 256 by 256 element phase correction array 337 is produced. This is accomplished by establishing one row (y=1) of phase data in the $\Phi$ array 335 as a reference and then finding the difference between the value of one of its elements and the same element o( in each of the other rows (y=2 to 256) of the $\Phi$ array 335. This is repeated for each element (x=1 to 256) of the reference row (y=1) and the calculated difference values ($\Delta\Phi_P$) are stored in the corresponding location in the phase correction array 337. Thus, each value in the phase correction array 337 indicates the amount by which the phase of each element of the NMR data set should be corrected. This corrects for in-view motion in any direction (x, y or z). How this correction is actually made will be described in more detail below.

While separate phase correction values $\Delta\Phi_P$ are calculated for each of the 256 by 256 elements of the array 337 in the preferred embodiment, it should be apparent that a less rigorous approach can also be used. If the in-view motion is known to occur over only a small segment of the x axis field of view, then the calculation of corrective values $\Delta\Phi_P$ may be limited to that segment. Furthermore, if the in-view motion is uniform over that x axis segment, then perhaps a single value $\Delta\Phi_P$ will suffice as a correction over the entire segment. Since these corrections are applied retrospectively to the acquired NMR data set, it is contemplated that correction variables such as this will be under operator control and the radiologist can manipulate the corrections to obtain the image he needs in minimal time.

When calculating the phase corrections which are to be made, one must consider whether both moving and stationary spins are contributing to the measured phase values. Where all the spins are moving, no further correction is necessary. However, when stationary spins are contributing substantial signal, then the phase correction values can be further refined.

Figure 10:
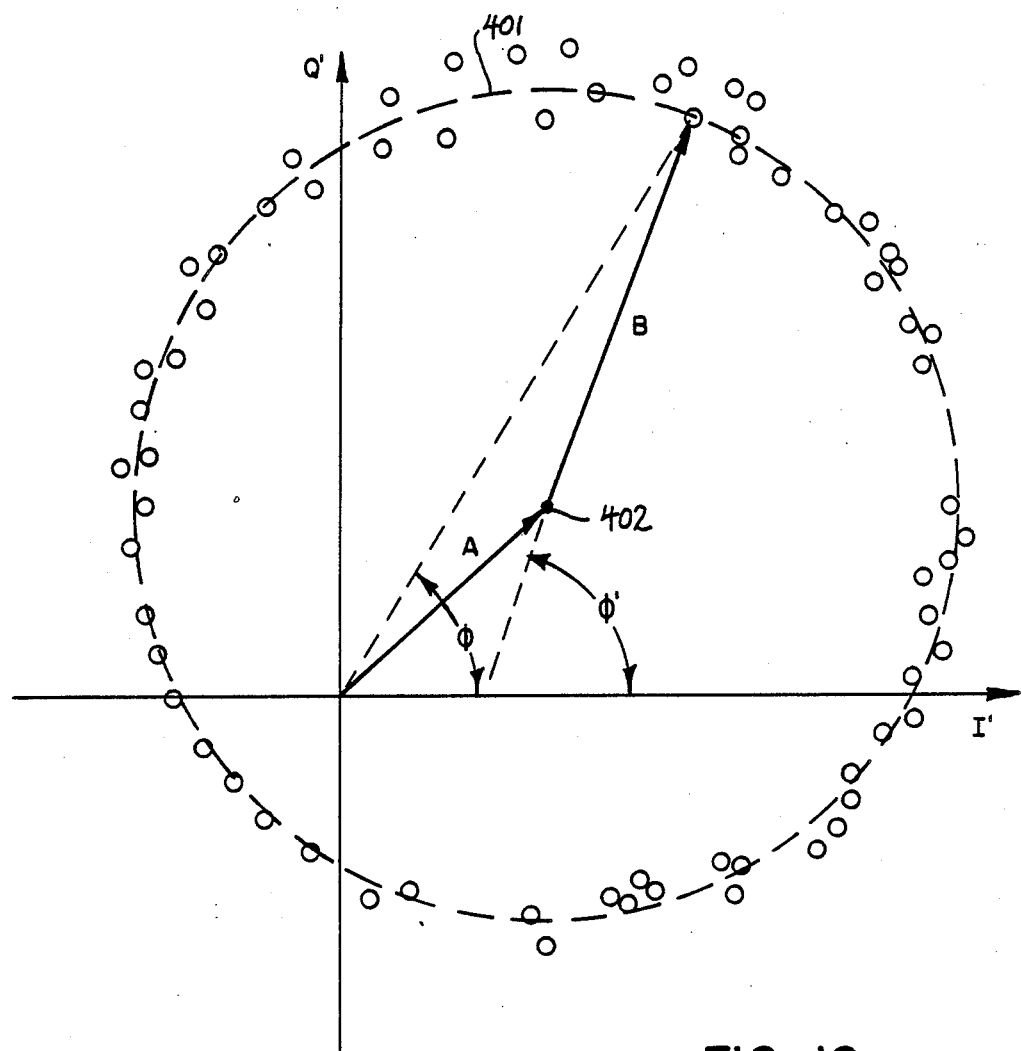
FIG. 10 is a plot of hybrid-space data which illustrates the effects of both stationary and moving spins on hybrid-space phase.

The effects of NMR signal components produced by both stationary and moving spins is illustrated in FIG. 10. The points on this plot represent the I' and Q' values for the 256 data samples in a single column of the hybrid-space data sets 312 and 313. These points define a circle which is illustrated by dashed line 401 having a center 402. If no motion were present, all of the points in this ring would cluster at one location. On the other hand, if all the spins are in motion, then the ring 401 would be formed, but its center 402 would be at the origin (Q'=0, I'=0). In the illustrated example, the signal components due to stationary spins are represented by the vector A which offsets the center 402 from the origin. The signal component due to moving spins is represented by the vector B and its magnitude determines the size of the circle 401. The values (Φ) in the phase array 335 discussed above indicate the phase angle of the combined stationary and moving spins. To provide a more accurate correction for in-view motion, therefore, the values in the phase array 335 should be altered to indicate the phase Φ' of only the moving spins.

This alteration of the phase array values is performed on one column at a time. First, the 256 data points in the column of the hybrid-space arrays 312 and 313 are applied to a curve fitting program which determines the center 402 of the circle 401. The coordinate values of the center 402 are then subtracted from the values in that column of the respective hybrid-space arrays 312 and 313. These altered values are then used to produce the altered phase array 335, which, in turn, is used to produce the more accurate phase correction array 337 as described above.

While the phase error detection method described above works well when applied to a hybrid-space phase array which is derived from data acquired from navigator NMR signals, less rigorous phase error detection methods are also possible using the NMR image data set itself. For example, the I and Q arrays 310 and 311 can be used to calculate a 256×256 phase array in k-space. While the phase values in this array may not be useful at its outer boundaries, the phase information at the center column (x=128) where the peak of the NMR echo signal 305 is sampled is usually unambiguous. One element in this column is selected as the reference and all the other values are compared with it to produce a 1×256 element phase correction array. These correction values ΔΦ$_P$ may be applied to the NMR data set as will now be described.

All of the corrections calculated according to the present invention can be made to the NMR raw image data set I and Q in k-space. In k-space all of the corrections are implemented as a rotation of the phase of each NMR signal sample ($S_{xy}=I_{xy}+jQ_{xy}$). The corrected NMR data set $S'_{xy}$ may thus be calculated as follows:

$$S'_{xy}=e^{j\Delta\Phi}R_{xy} \qquad (6)$$

This rotation is implemented in the I and Q arrays 310 and 311 in accordance with the following expressions:

$$I_{xy}(\text{corrected})=I_{xy}\cos\Delta\Phi_T-Q_{xy}\sin\Delta\Phi_T$$

$$Q_{xy}(\text{corrected})=I_{xy}\sin\Delta\Phi_T+Q_{xy}\cos\Delta\Phi_T$$

The phase change ΔΦ$_T$ is the arithmetic sum of the phase changes needed to make all of the above-described corrections. Specifically, the total phase correction ΔΦ$_T$ is calculated as follows:

$$\Delta\Phi_T=-(\Delta\Phi_R+K^*\Delta\Phi_P+\Delta\Phi_x+\Delta\Phi_y) \qquad (7)$$

This expression includes the rollback correction ΔΦ$_R$ from the array 331 (FIG. 5) and the phase correction ΔΦ$_P$ from the array 337 (FIG. 5). The phase correction ΔΦ$_P$ is multiplied by a conversion factor K, however, to account for any difference in phase shifts between the image NMR signal and a navigator NMR signal which may be used to determine the phase shift correction. If the image NMR data set is used to calculate the phase corrections, this conversion factor is "one". Otherwise, the value of K is measured by comparing the phase shift produced in image data (with phase encoding gradient applied) and the phase shift produced in the navigator data. In the alternative, the value of K can be calculated.

The phase rotations ΔΦ$_x$ and ΔΦ$_y$ are made to correct for view-to-view motion and flow effects along the respective x and y axes. These phase corrections are calculated from the shift values S in the shift correction array 330 (FIG. 5):

$$\Delta\Phi_x=S_x^*(x-(N_x-1)/2)^*2\pi/N_x \qquad (9)$$

where:
S$_x$=shift correction from array 330
x=sample number (i.e. 0 through 255)
N$_x$=total number of samples during read-out (256).

$$\Delta\Phi_y=S_y^*(y-(N_y-1)/2)^*2\pi/N_y \qquad (10)$$

where:
S$_y$=shift correction calculated from navigator signal acquired in presence of a y axis magnetic field gradient
y=phase encoding view number (0 to 255)
N$_y$=total number of phase encoding views (256).

It should be apparent that the correction is different for each element of the NMR image data arrays I and Q because the total phase correction ΔΦ$_T$ is different for each x and y location in these arrays.

As indicated above, the corrective methods of the present invention are applied to the NMR data set which has been acquired for the purpose of producing the desired image. While this same image data set can also be used to derive the corrective values which are to be applied to it, an alternative procedure is to produce a separate NMR data set during the same acquisition scan from which the corrective values can more accurately be derived. This separate NMR data set is produced by acquiring one or more "navigator" NMR signals during each pulse sequence. The main distinction of these navigator NMR signals is that they are not subject to the application of incremented phase encoding gradients. In some cases, a constant phase encode gradient may be used to elicit two-dimensional investigatory information.

Figure 9:
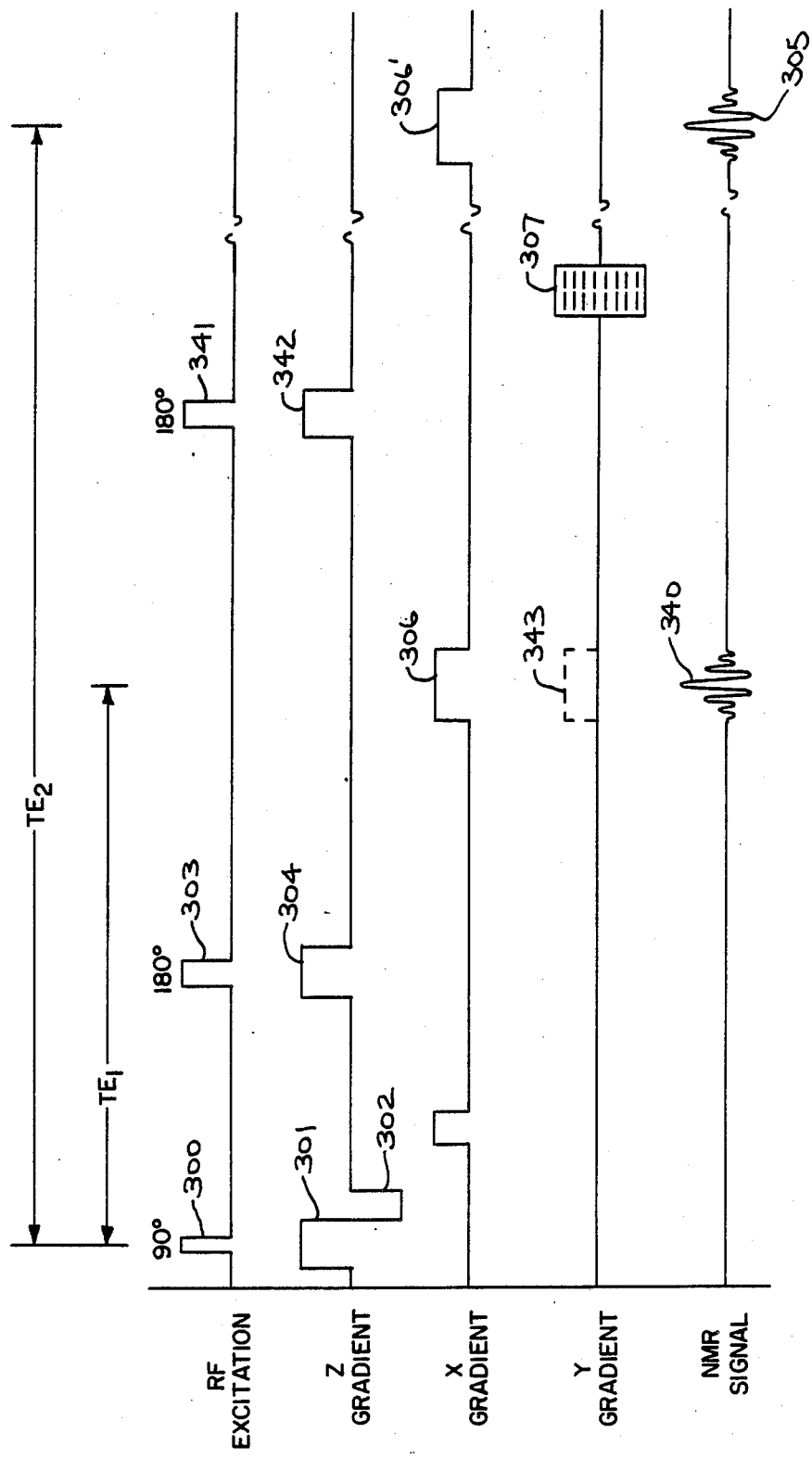
FIG. 9 is a graphic representation of an alternative pulse sequence used to acquire both image NMR data and navigator NMR data.

A navigator pulse sequence is shown in FIG. 9. As with the conventional pulse sequence of FIG. 3, the spins are excited by a 90° selective RF excitation pulse 300 in the presence of slice select gradient pulses 301 and 302, and at a time interval TE$_1$/2 later, the spins are subjected to a 180° selective RF excitation pulse 303 in the presence of slice select gradient pulse 304. No phase encoding gradients are applied, however, and at interval TE$_1$ an NMR echo signal 340 is acquired in the presence of x axis read-out gradient pulse 306. A second 180° RF excitation pulse 341 is then produced in the presence of a slice select gradient pulse 342, and the y axis phase encoding pulse 307 is then applied. The resulting NMR echo signal 305 produced at TE$_2$ is then acquired in the presence of read-out gradient pulse 306' to build the NMR image data set as described above.

The NMR data set which is created by acquiring the NMR navigator signal 340 is subject to substantially the same motion effects as the NMR image data set which is acquired at the same time. However, because the navigator signals 340 are not phase encoded, the magnitude of the navigator NMR signals 340 are not significantly diminished at the extremities of the field of view. Corrective values can, therefore, be more readily calculated using the NMR navigator signal data set rather than the NMR image data set. The corrective values described above are thus determined by using the acquired NMR navigator signal data set, and these corrective values are then applied to the NMR image data set. The corrected NMR image data set is then used to reconstruct an image.

Referring again to FIG. 5, the NMR navigator signal data set is transformed first along the read-out gradient direction to produce the hybrid-space I' and Q' arrays 312 and 313. This data is then used as described above to produce a shift correction array 330, a rollback correction array 331 and a phase correction array 337. These corrective values are applied to the NMR image data set 310 and 311 (FIG. 4) as described above, and the corrected NMR image data set is processed in the usual manner to produce the corrected image array 316 (FIG. 4).

The shift corrections S correct for view-to-view motion in the direction of the read-out gradient. Accordingly, the NMR navigator signal 340 in FIG. 9 is acquired in the presence of the read-out gradient pulse 306 which is directed along the x axis and the shift corrections will compensate for motion along the x axis. Alternatively, the NMR navigator signal 340 can also be acquired in the presence of a read-out gradient pulse which is directed along the phase encoding, or y axis, as shown by the dashed lines 343. In yet another alternative, the pulse sequence can be modified to produce two NMR navigator signals, with one being acquired during an x axis read-out gradient pulse and the other being acquired in the presence of a y axis read-out gradient pulse. Either one of the navigator signal NMR data sets can then be used to produce the phase correction array 337 (FIG. 5), while both navigator signal NMR data sets are used to produce corresponding shift correction arrays 330. A rollback correction array 331 is not always required for shift corrections made in the phase encoding direction, y. Both the x and y shift corrections can be made in hybrid-space, or they may be converted to phase angle corrections which are made to the NMR image data set in k-space as described above.

The two-dimensional shift correction data can also be derived using a single navigator NMR signal acquired during the application of a read-out gradient. As previously described, the magnitude of the navigator NMR signal yields the correction values S along the frequency encoding direction (x). In addition, however, the phase of this navigator NMR signal can be used to calculate the correction values along the phase encoding direction (y) as follows:

$$\frac{\Delta \Phi_y}{N_y} = \frac{\Delta \Phi_{py}}{A_y} \quad (11)$$

where: $\Delta \Phi_{py}$ is the measured phase shift, $A_y$ is the amplitude of the applied phase encoding gradient, and $N_Y$ is the number of phase encoding increments (i.e. views).

The correction values for use in the above equation (10) for the y direction is, therefore, given by the following when $N_y$ is (256):

$$\Delta \Phi_y = \frac{\Delta \Phi_{py}(256)}{2\pi(j - 128.5)} \quad (12)$$

where: j is the view number.

While the navigator NMR signal is an echo signal in the preferred embodiment, this is not a necessary requirement. The navigator NMR signal may also be produced as a gradient recalled signal or as the result of three-dimensional data acquisition pulse sequence.

The preferred embodiment of the above-described invention is implemented by a Fortran program which is executed by the main computer 101 for correcting in-view motion and view-to-view motion in the direction of the x axis read-out gradient.

While the corrective values which are derived according to the present invention are employed retrospectively to improve image quality, they can also be employed to alter the scan. This is particularly true of the shift values S which correct for view-to-view motion. More specifically, as each pulse sequence is executed and a row of raw NMR data is acquired for the image arrays 310 and 311, the row of data may be transformed to hybrid-space (equation (1)), the modulus values calculated (equation (4)), and a correlation made with the previously acquired row of NMR data (equation (5)). The resulting shift value S can then be used to alter the operating conditions of the NMR system before the next pulse sequence is executed. For example, where the shift value corrects for motion in the y axis direction, the phase of the RF carrier signal produced by the transmit frequency synthesizer 200 (FIG. 2) is changed by the amount $-\Delta \Phi_y$ (equation (9)). Similarly, a shift correction for motion along the slice select direction (z axis) can be made by changing the frequency of the RF carrier produced by the transmit frequency synthesizer 200. Shift corrections for motion along the read-out direction (x axis) can be made by changing the location of the field of view along the x axis.

The present invention addresses the problems currently associated with magnetic resonance angiography. In addition, this invention is necessary for quantitative tissue characterization using magnetic resonance. The invention is not limited to Fourier image reconstructions (i.e. 2DFT or 3DFT) and may be used with line scanning and other projection reconstructions.

We claim:

1. An NMR system, the combination comprising:
    means for generating a polarizing magnetic field;
    excitation means for generating an RF excitation magnetic field which produces transverse magnetization in nuclei subjected to the polarizing magnetic field;
    receiver means for sensing the NMR signal produced by the transverse magnetization and producing digitized in-phase (I) and quadrature (Q) samples of the NMR signal;
    first gradient means for generating a first magnetic field gradient to impart a first phase component into the NMR signal which is indicative of the location of the transversely magnetized nuclei along a first coordinate axis;

second gradient means for generating a second magnetic field gradient to impart a second phase component into the NMR signal which is indicative of the location of the transversely magnetized nuclei along a second coordinate axis;

pulse control means coupled to the excitation means, first and second gradient means, and receiver means, said pulse control means being operable to conduct a scan in which a series of pulse sequences are conducted in which the second magnetic field gradient is stepped through a series of discrete values and a corresponding series of NMR signals are sensed and digitized to form an NMR data set; and processor means for storing the NMR data set and for reconstructing an image array for a display from the stored NMR data set by:
 (a) Fourier transforming the NMR data set along one of its dimensions to create hybrid-space data arrays I' and Q';
 (b) producing a correction data array using the data in the hybrid-space data arrays I' and Q' by calculating the magnitude of the transformed sampled NMR signals in the hybrid-space data arrays I' and Q' to produce a modulus array, and correlating each row of the modulus array to produce a corresponding shift value for the correction data array;
 (c) applying the data in the correction data array to the NMR data set to reduce motion effects; and
 (d) Fourier transforming the corrected NMR image data set to produce the image array.

2. The NMR system as recited in claim 1 in which a rollback correction data array is produced from the corresponding shift values in the correction data array and a rollover rate $K_R$, and the rollback correction data array values are applied to correct the NMR image data set in step (c).

3. An NMR system, the combination comprising:
means for generating a polarizing magnetic field;
excitation means for generating an RF excitation magnetic field which produces transverse magnetization in nuclei subjected to the polarizing magnetic field;
receiver means for sensing the NMR signal produced by the transverse magnetization and producing digitized in-phase (I) and quadrature (Q) samples of the NMR signal;
first gradient means for generating a first magnetic field gradient to impart a first phase component into the NMR signal which is indicative of the location of the transversely magnetized nuclei along a first coordinate axis;
second gradient means for generating a second magnetic field gradient to impart a second phase component into the NMR signal which is indicative of the location of the transversely magnetized nuclei along a second coordinate axis;
pulse control means coupled to the excitation means, first and second gradient means, and receiver means, said pulse control means being operable to conduct a scan in which a series of pulse sequences are conducted in which the second magnetic field gradient is stepped through a series of discrete values and a corresponding series of NMR signals are sensed and digitized to form an NMR data set; and processor means for storing the NMR data set and for reconstructing an image array for a display from the stored NMR data set by:
 (a) Fourier transforming the NMR data set along one of its dimensions to create hybrid-space data arrays I' and Q';
 (b) producing a correction data array using the data in the hybrid-space data arrays I' and Q' by calculating the phase of the transformed sampled NMR signals in the hybrid-space data arrays I' and Q' to produce a two-dimensional phase array, and determining the difference in phase between elements in a reference row of the phase array and elements in the same column of the phase array to produce the values for the correction data array;
 (c) applying the data in the correction data array to the NMR data set to reduce motion effects; and
 (d) Fourier transforming the corrected NMR image data set to produce the image array.

4. The NMR system as recited in claim 1 in which a second correction data array is produced by calculating the phase of the transformed sampled NMR signals in the hybrid-space data arrays I' and Q' to produce a two-dimensional phase array, and determining the phase difference between elements in a reference row of the phase array and elements in the same column of the phase array to produce the values for the second correction data array.

5. An NMR system, the combination comprising:
means for generating a polarizing magnetic field;
excitation means for generating an RF excitation magnetic field which produces transverse magnetization in nuclei subjected to the polarizing magnetic field;
receiver means for sensing the NMR signal produced by the transverse magnetization and producing digitized in-phase (I) and quadrature (Q) samples of the NMR signal;
first gradient means for generating a first magnetic field gradient to impart a first phase component into the NMR signal which is indicative of the location of the transversely magnetized nuclei along a first coordinate axis;
second gradient means for generating a second magnetic field gradient to impart a second phase component into the NMR signal which is indicative of the location of the transversely magnetized nuclei along a second coordinate axis;
pulse control means coupled to the excitation means, first and second gradient means, and receiver means, said pulse control means being operable to conduct a scan in which a series of pulse sequences are conducted in which the second magnetic field gradient is stepped through a series of discrete values and a corresponding series of NMR signals are sensed and digitized to form an NMR data set; and
processor means for storing the NMR data set and for reconstructing an image array for a display from the stored NMR data set by:
 (a) Fourier transforming the NMR data set along one of its dimensions to create hybrid-space data arrays I' and Q';
 (b) producing a correction data array using the data in the hybrid-space data arrays I' and Q';

(c) applying the data in the correction data array to the NMR data set to reduce motion effects; and (d) Fourier transforming the corrected NMR image data set to produce the image array; and in which the NMR data set acquired during the scan includes NMR navigator data which has been subjected to one of said two magnetic field gradients and NMR image data which has been subjected to both of said two magnetic field gradients, and steps (a) and (b) are performed with the NMR navigator data and step (c) is performed on the NMR image data.

6. In an NMR system which performs a scan to acquire an NMR data set from which an image array is reconstructed, the improvement comprising:

transforming an NMR data set produced by the NMR system to create a hybrid-space data array by performing a Fourier transformation on the NMR data set along one of its dimensions;

producing a correction data array using the data in the hybrid-space data array by calculating the magnitude of each element of the hybrid-space data array to produce a corresponding modulus array, and correlating each row of the modulus array to produce a corresponding shift value for the correction data array;

applying the data in the correction data array to an NMR data set produced by the NMR system to reduce artifacts caused by motion in the acquired NMR data set; and producing an image array from the corrected NMR data set.

7. The improvement as recited in claim 6 in which a rollback correction data array is produced from the corresponding shift values in the correction data array and a rollover rate $K_R$, and the values in both the correction data array and the rollback correction data array are applied to correct said acquired NMR data set used to produce the image array.

8. In an NMR system which performs a scan to acquire an NMR data set from which an image array is reconstructed, the improvement comprising:

transforming an NMR data set produced by the NMR system to create a hybrid-space data array by performing a Fourier transformation of the NMR data set along one of its dimensions;

producing a correction data array using the data in the hybrid-space data array by calculating the phase of each element of the hybrid-space data array to produce the corresponding elements of a two-dimensional phase data array, and determining the difference in phase between elements in a reference row of the phase data array and elements in the same column of the phase data array;

applying the data in the correction data array to an NMR data set produced by the NMR system to reduce artifacts caused by motion in the acquired NMR data set; and producing an image array from the corrected NMR data set.

9. The improvement as recited in claim 7 which a second correction data array is produced by:

calculating the phase of each element of the hybrid-space data array to produce the corresponding elements of a two-dimensional phase data array having rows and columns; and calculating the elements of the second correction data array by determining the difference in phase between elements in a reference row of the phase data array and elements in the same column of the phase data array;

wherein the data in both the correction data array and the second correction data array is applied to the acquired NMR data set to reduce the effects of motion.

10. The improvement as recited in claim 6 in which the NMR data set used to create the hybrid-space data array is acquired from a navigator NMR signal which is produced during each pulse sequence of a scan but which is not subjected to a changing magnetic field gradient during the scan, and the NMR data set employed to produce the image array is acquired from an NMR signal which is produced during each pulse sequence of the scan and which is subject to a phase encoding magnetic field gradient which changes during the scan.

11. The improvement as recited in claim 10 in which each navigator NMR signal is produced in the same pulse sequence with its corresponding phase encoded NMR signal.

12. An NMR system, the combination comprising:

means for generating a polarizing magnetic field;

excitation means for generating an RF excitation magnetic field which produces transverse magnetization in nuclei subjected to the polarizing magnetic field;

receiver means for sensing the NMR signal produced by the transverse magnetization and producing digitized in-phase (I) and quadrature (Q) samples of the NMR signal;

first gradient means for generating a first magnetic field gradient to impart a first phase component into the NMR signal which is indicative of the location of the transversely magnetized nuclei along a first coordinate axis;

second gradient means for generating a second magnetic field gradient to impart a second phase component into the NMR signal which is indicative of the location of the transversely magnetized nuclei along a second coordinate axis;

pulse control means coupled to the excitation means, first and second gradient means, and receiver means, said pulse control means being operable to conduct a scan in which a series of pulse sequences are conducted in which the second magnetic field gradient is stepped through a series of discrete values and a corresponding series of NMR signals are sensed and digitized to form an NMR data set; and processor means for storing the NMR data set and for reconstructing an image array for a display from the stored NMR data set by:

(a) producing a phase array from the NMR data set which indicates the phase of the digitized NMR signals;

(b) producing correction data using the data in the phase array;

(c) applying the correction data to the NMR data set to reduce motion effects; and (d) Fourier transforming the corrected NMR image data set to produce the image array.

13. An NMR system, the combination comprising:

means for generating a polarizing magnetic field;

excitation means for generating an RF excitation magnetic field which produces transverse magnetization in nuclei subjected to the polarizing magnetic field;

receiver means for sensing the NMR signal produced by the transverse magnetization and producing digitized in-phase (I) and quadrature (Q) samples of the NMR signal;

first gradient means for generating a first magnetic field gradient to impart a first phase component into the NMR signal which is indicative of the location of the transversely magnetized nuclei along a first coordinate axis;

second gradient means for generating a second magnetic field gradient to impart a second phase component into the NMR signal which is indicative of the location of the transversely magnetized nuclei along a second coordinate axis;

pulse control means coupled to the excitation means, first and second gradient means, and receiver means, said pulse control means being operable to conduct a scan in which a series of pulse sequences are conducted in which the second magnetic field gradient is stepped through a series of discrete values and a corresponding series of NMR signals are sensed and digitized to form an NMR data set; and processor means for storing the NMR data set and for reconstructing an image array for a display from the stored NMR data set by:

(a) producing a phase array from the NMR data set which indicates the phase of the digitized NMR signals;

(b) producing an altered phase array by subtracting phase components produced by stationary spins from each value in the phase array;

(c) producing correction data using the data in the altered phase array;

(d) applying the correction data to the NMR data set to reduce motion effects; and (e) transforming the corrected NMR image data set to produce the image array.

14. The NMR system as recited in claim 13 in which the phase components produced by stationary spin are calculated by determining the center of a circle which best fits the values in each column of the phase array.

* * * * *